(12) United States Patent
Gross

(10) Patent No.: US 9,014,770 B2
(45) Date of Patent: Apr. 21, 2015

(54) MAGNETIC FIELD GENERATION DEVICE WITH ALTERNATIVE QUENCH DEVICE

(71) Applicant: Patrick Gross, Buckenhof (DE)

(72) Inventor: Patrick Gross, Buckenhof (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 13/939,378

(22) Filed: Jul. 11, 2013

(65) Prior Publication Data

US 2014/0018243 A1    Jan. 16, 2014

(30) Foreign Application Priority Data

Jul. 11, 2012 (DE) .......................... 10 2012 212 063

(51) Int. Cl.
| | |
|---|---|
| G01R 33/035 | (2006.01) |
| G01R 33/34 | (2006.01) |
| G01R 33/38 | (2006.01) |
| G01R 33/3815 | (2006.01) |
| H01F 6/02 | (2006.01) |
| H01F 6/04 | (2006.01) |
| G01R 33/28 | (2006.01) |

(52) U.S. Cl.
CPC ........ *G01R 33/34023* (2013.01); *G01R 33/288* (2013.01); *G01R 33/3804* (2013.01); *G01R 33/3815* (2013.01); *H01F 6/02* (2013.01); *H01F 6/04* (2013.01)

(58) Field of Classification Search
CPC .......... G01R 33/0358; G01R 33/0352; H01L 39/225; H01L 39/2496
See application file for complete search history.

(56) References Cited

U.S. PATENT DOCUMENTS

| | | | | |
|---|---|---|---|---|
| 7,408,350 | B2 * | 8/2008 | Bittner | 324/318 |
| 7,615,998 | B2 * | 11/2009 | Huang et al. | 324/319 |
| 7,876,100 | B2 * | 1/2011 | Huang et al. | 324/319 |
| 2006/0236709 | A1 | 10/2006 | Steinmeyer | |
| 2007/0126424 | A1 | 6/2007 | Bittner | |
| 2010/0022395 | A1 | 1/2010 | Bittner | |
| 2010/0295642 | A1 | 11/2010 | Hahn et al. | |
| 2011/0173996 | A1 | 7/2011 | Glajchen et al. | |

* cited by examiner

*Primary Examiner* — Colleen Dunn
(74) *Attorney, Agent, or Firm* — Schiff Hardin LLP

(57) ABSTRACT

A magnetic field generation device for a magnetic resonance tomography apparatus has a vacuum container that encloses a magnetic coil made of superconducting material, and a conduit of a pipe system is connected with the magnetic coil so as to conduct heat. The pipe system and the conduit are filled with a coolant that places the magnetic coil in a superconducting state during normal operation of the tomography system. A valve connects the pipe system to the interior of a capture container. In the event of non-normal operation, such as a quench, evaporated coolant passes through the valve into the capture container.

16 Claims, 3 Drawing Sheets

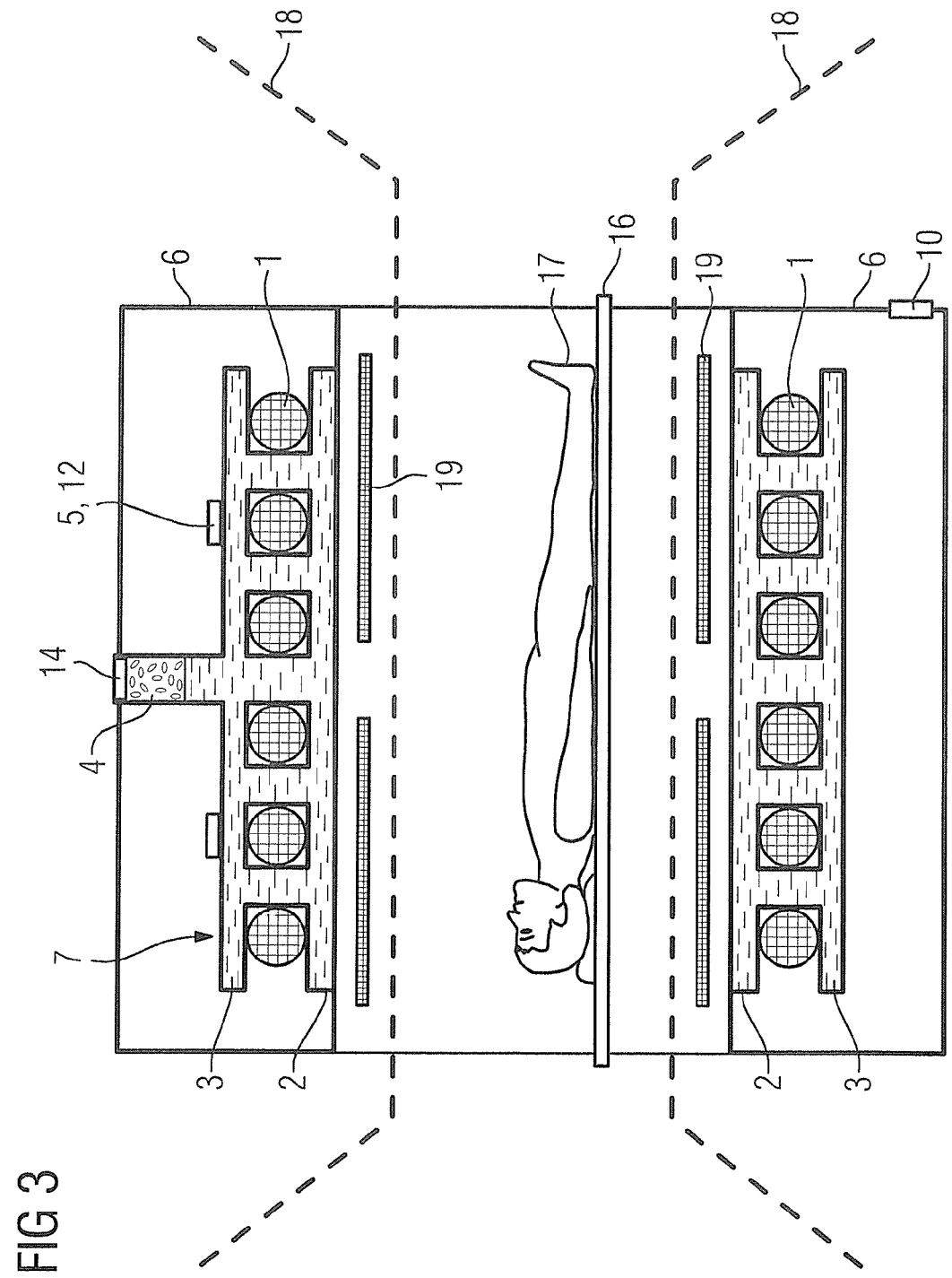

MAGNETIC FIELD GENERATION DEVICE WITH ALTERNATIVE QUENCH DEVICE

BACKGROUND OF THE INVENTION

1. Field of the Invention

The invention concerns a magnetic field generation device for an apparatus for magnetic resonance tomography, as well as an apparatus for magnetic resonance tomography with such a magnetic field generation device.

2. Description of the Prior Art

Magnetic resonance tomography is an imaging modality for which very high magnetic fields (up to multiple Tesla) are required. Superconducting magnetic coils are used to generate such high magnetic fields. So that the material of the magnetic coils is superconducting, it must be significantly cooled. Such a cooling typically takes place with liquid helium. The helium in conventional apparatuses for magnetic resonance tomography is located together with the magnetic coils in a cryostat. The container in which the liquid helium and the magnetic coils are located is surrounded by a thermally insulated vacuum container with a vacuum therein. If the magnetic coils transition into the normally conductive state, an event known as a quench occurs, and the energy of the magnetic field is transduced into heat. The liquid helium thereby suddenly vaporizes and expands at the transition into the gas phase. In order to avoid an explosion of the cryostat, the gas is discharged via a component known as a quench pipe. In order to avoid consequential damage (such as asphyxiation of patients and treatment personnel), the gaseous helium is discharged into a region outside of the room in which the apparatus for magnetic resonance tomography is located. The helium is thereby lost, and an expensive refilling of the cryostat with liquid helium is necessary. Furthermore, the installation of a quench pipe is complicated, and the quench pipe, or the valve installed therein, must be regularly monitored for blockage (for example by ice formation).

From DE 10 2005 042 112 B3, a device is known for monitoring a quench pipe of a superconducting magnet with a quench pipe inside of which are arranged at least one illumination unit and at least one image acquisition unit. The image acquisition unit is furthermore connected with an image presentation unit so that the state of the inside of the quench pipe can be monitored visually. Blockages (by ice, for example) can therefore be detected.

SUMMARY OF THE INVENTION

An object of the present invention is to provide a magnetic field generation device with an alternative quench device that allows a recovery of the coolant evaporated upon a quench.

The invention is based on a magnetic field generation device, wherein a vacuum container surrounds at least one magnetic coil made of superconducting material, and a conduit connected with the coolant circulation system is connected with the superconducting magnetic coil so as to conduct heat, at least in part. When the circulation system (and therefore the conduit) is filled with a coolant, the conduit cools the magnetic coil. The invention is based on connecting a valve with the circulation system so that the valve is suitable to regulate the passage of gases between the circulation system and the inside of a capture container. In the event of a quench, the evaporated coolant can therefore be captured in the capture container and be recovered again.

In a further embodiment, the capture container to capture the coolant is the vacuum container, so the valve between the conduit and the inside of the capture container is not at risk of icing over, since the moisture in the vacuum container is extremely low.

In a further embodiment, the pipe system has at least one conduit that proceeds along the winding of the magnetic coil. A particularly efficient cooling is thereby enabled.

In a further embodiment, a pressure sensor is arranged in the pipe system and/or one of the aforementioned valves is equipped with a pressure sensor so that the pressure inside the pipe system can be monitored.

In a further embodiment, the magnetic field generation device has an additional valve that is suitable for regulation of the passage of gases between the inside of the capture container and the space outside of said capture container. The coolant can thereby be particularly simply recovered from the capture container after a quench.

In a further embodiment, at least one conduit of the pipe system can be connected with a reservoir so that an outlet exists for gases and/or fluids from the reservoir into the pipe system. If the pipe system is filled with fluid, cooling is thereby enabled via the thermosiphon principle.

The invention also encompasses an apparatus for magnetic resonance tomography with a magnetic field generation device according to any of the above-described embodiments, wherein the valve is mounted above the magnetic coil, between the pipe system and the inside of the vacuum container. The apparatus enabling the gaseous coolant to escape in the event of a quench, with no liquid coolant coming into contact with the valve.

BRIEF DESCRIPTION OF THE DRAWINGS

FIG. 3 shows a magnetic resonance tomography apparatus in accordance with the invention, in longitudinal section.

DESCRIPTION OF THE PREFERRED EMBODIMENTS

Figure 1:
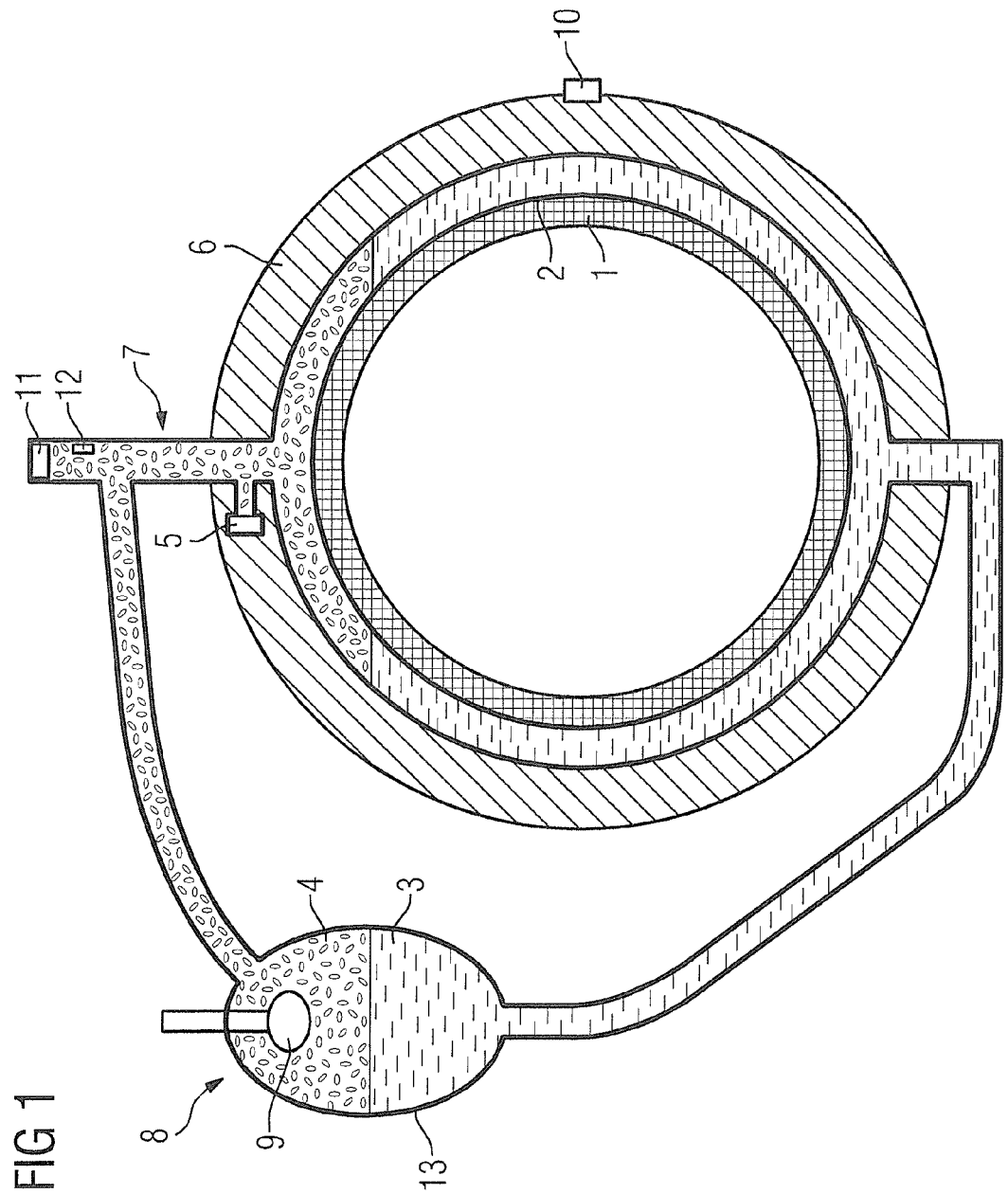
FIG. 1 shows an embodiment of a magnetic field generation device in accordance with the invention in cross-section, for a magnetic resonance tomography apparatus.

FIG. 1 shows a magnetic field generation device for a magnetic resonance tomography apparatus, having a cylindrical vacuum container 6 in which are located multiple annular magnetic coils 1 made of superconducting material. The vacuum container 6 and the magnetic coils 1 are arranged essentially concentrically. Furthermore, the magnetic field generation device has a pipe system 7 that has conduits 2 that have a heat-conducting connection with the magnetic coils 1 and are in part arranged concentrically with the magnetic coils 1. The pipe system 7 is filled with liquid helium 3 as a coolant. Liquid helium 3 enables the superconducting material of the magnetic coil 1 to be cooled below the transition temperature, such that it transitions from the normally conducting state into the superconducting state. The filling of the pipe system 7 requires markedly less liquid helium 3 than submerging the magnetic coil 1 into liquid helium 3, as in conventional cryostats. For the magnetic field generation device shown here, only approximately 0.02 m³ liquid helium 3 is required for the magnetic resonance tomography apparatus (in particular for medical imaging).

Furthermore, a first valve 5 is mounted at a conduit 2 of the pipe system 7 so that it enables gaseous helium 4 to pass from the pipe system 7 into the vacuum container 6. In the event of a quench, the gaseous helium 4 can then be conducted into the vacuum container 6. The gaseous helium 4 cools due to the expansion in the vacuum container 6. Due to the reduced volume of the liquid helium 2 relative to conventional cryostats, the gaseous helium 4 can be captured by the vacuum container 6 without danger.

The magnetic field generation device has a second valve 10 that is suitable to regulate the passage of gases (in particular of gaseous helium 4) between the inside of the vacuum container 6 and the space outside of the vacuum container 6. It is thereby possible to capture the gaseous helium 6 and reuse it.

The magnetic field generation device has a third valve 11 that is suitable to regulate the passage of gases (in particular of gaseous helium 4) between the pipe system 7 and the space outside of the vacuum container 6. For example, in the event of a quench the gaseous helium 4 can first be diverted into the vacuum container 6 until a certain pressure has built up in it. The remaining gaseous helium 4 (which is at a lower pressure than the gas escaping at the start of the quench) can then be harmlessly diverted into a space, for example into the room in which the magnetic resonance tomography apparatus is located, or even into the open environment with the use of a quench pipe. If a quench pipe is used, it turns is markedly smaller than in prior art systems, because less gas, under lower pressure, must be diverted. In particular, the quench pipe can have a diameter of less than 10 cm.

A pressure sensor 12 is arranged in the pipe system 7 so that the pressure inside the pipe system 7 can be measured. Furthermore, the first valve 5 between the pipe system 7 and the inside of the vacuum container 6 and/or the third valve 11 between the pipe system 7 and the space outside of the vacuum container 6 can be opened or closed depending on the pressure measured by the pressure sensor 12. In addition or as an alternative to the pressure sensor 12, the first valve 5 between the pipe system 7 and the inside of the vacuum container 6 and/or the third valve 11 between the pipe system 7 and the space outside of the vacuum container 6 can have a pressure sensor 5.

The conduit 2 is formed of aluminum, but other, non-ferromagnetic materials can also be used to produce the conduit 2. The individual conduits 2 are connected with one another by welding seams, but other joining techniques (such as gluing, riveting or bolting) can be used.

Furthermore, the pipe system 7 is connected with a cryo-unit 8 so that gaseous helium 4 is conducted through the pipe unit [sic] 7 to the cryo-unit 8. For this, a conduit 2 connects the upper part of the pipe system 7 with the upper part of the cryo-unit 8. The cryo-unit 8 comprises a reservoir 13 and a cooling head 8 that is located in the reservoir 13. A circulation of the coolant according to the thermosiphon principle can be realized simply with the aid of the cryo-unit 8. The cooling head 8 cools the evaporated gaseous helium 4 until it condenses in the reservoir 13 and, as liquid helium 3, is available again as coolant. For this, a conduit 2 connects the lower part of the pipe system 7 with the lower part of the cryo-unit 8. The cryo-unit 8 can also be located within the vacuum container 6 or in a separate cryostat, which is different than is shown in FIG. 1.

Figure 2:
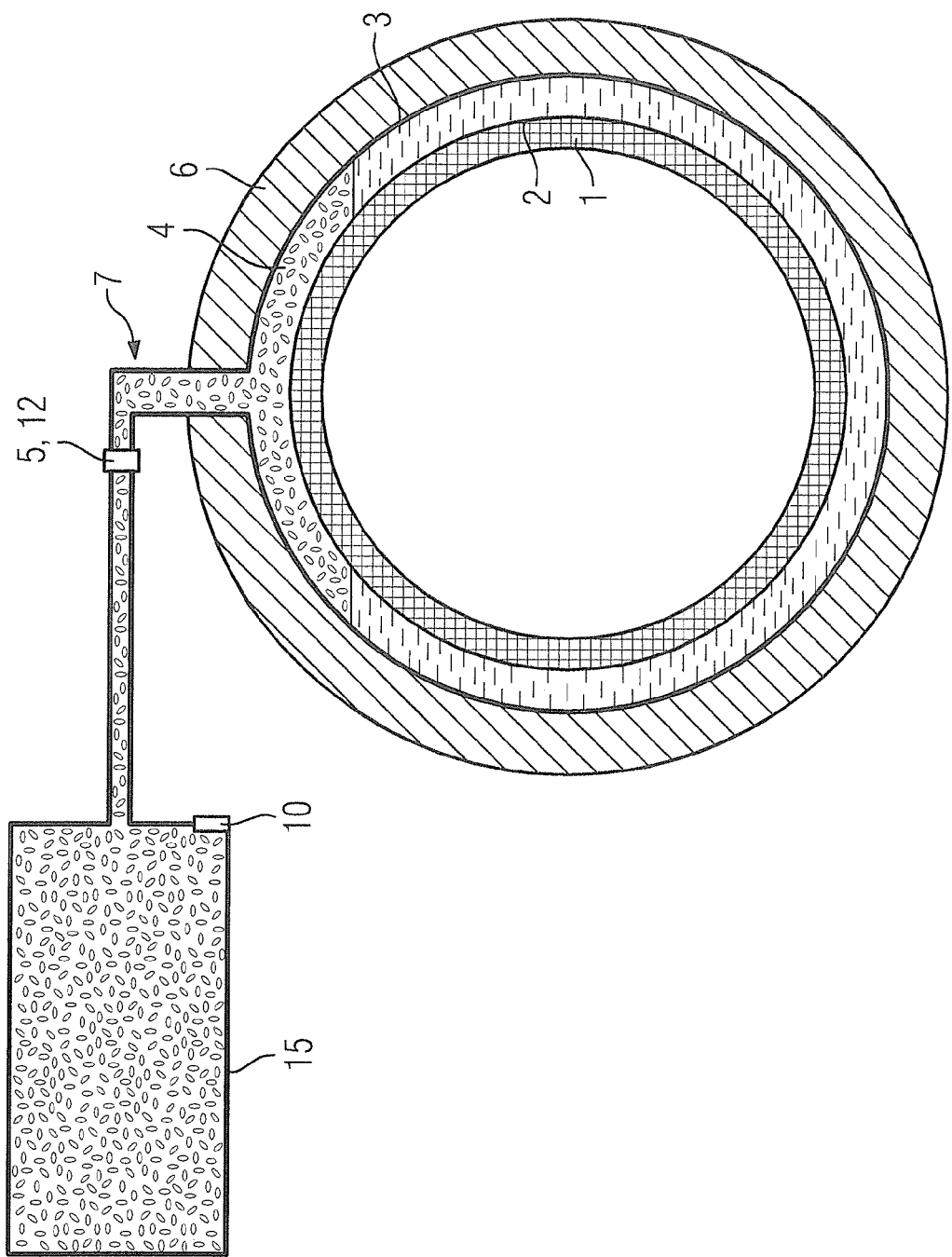
FIG. 2 shows a further embodiment of a magnetic field generation device in accordance with the invention in cross-section, for a magnetic resonance tomography apparatus.

FIG. 2 shows a magnetic field generation device for an apparatus for nuclear magnetic resonance tomography, comprising a cylindrical vacuum container 6 in which are located likewise cylindrical magnet coils 1 made of superconducting material. The vacuum container 6 and the magnetic coil 1 are arranged essentially concentrically. Furthermore, the magnetic field generation device has a pipe system 7 that has conduits 2 that have a heat-conducting connection with the magnetic coils 1 and are arranged concentrically in part with the magnetic coils 1. The pipe system 7 is filled with liquid helium 3. The gaseous helium 4 collects in the upper part of the pipe system 7. In the event of a quench, the helium 4 can be diverted through the valve 5 (which is provided with a pressure sensor 12) into a capture reservoir 15 that is located next to the magnetic resonance tomography apparatus, and therefore outside of the vacuum container 6. This capture container 15 can be designed to withstand its high pressure and compress the incoming gaseous helium 4. Analogous to the description in FIG. 1, such a capture container 15 can be equipped with a second valve 10 to recover the gaseous helium 4.

FIG. 3 shows a magnetic resonance tomography apparatus in longitudinal section with annular magnetic coils 1 that are located in a cylindrical vacuum container 6, wherein the magnetic coils 1 and the vacuum container 6 are arranged essentially concentrically. The pipe system 7 is likewise located in the vacuum container 6 and has conduits 2 that are in heat-conducting contact with the magnetic coils 1. Conduits 2 thereby extend like a fan between the annular magnetic coils 1. Furthermore, the pipe system has two cylindrical conduits 2, wherein one cylindrical conduit 2 is located on the inner side facing towards the patient 17 and the other conduit 2 is located on the outer side facing away from the patient 17. The two cylindrical conduits 2 are connected with one another via the fan-like conduits 2 between the coils so that they form a common internal space for circulation of the liquid helium 3.

Furthermore, the pipe system 7 has two valves 5 with a respective pressure sensor 12 that are suitable to conduct gaseous helium 4 into the inside of the vacuum container 6 in the event of a quench. The vacuum container 6 has an additional valve 10 that is suitable to conduct gaseous helium 4 out of the vacuum container 6 into the surrounding space. The valve 10 can be used in order to recover the gaseous helium 4 after a quench.

Furthermore, the pipe system 7 has a conduit 2 that extends into the space outside of the vacuum container 6. This conduit 2 furthermore has a burst disc 14 so that the gaseous helium 4 can also be conducted into a space outside of the vacuum container 6 in the event of a quench and too high a pressure in the pipe system 7. With the burst disc 14 the conduit 2 can be connected with a quench pipe in order to be able to conduct the gaseous helium 4 into the free environment.

The magnetic resonance tomography apparatus also has radio-frequency coils 19 that are suitable for transmission and/or reception of radio-frequency signals. They are located outside of the vacuum container 6 on the side facing toward the patient 17. The radio-frequency coils 19 and the vacuum container 6 are both surrounded by a cylindrical casing 18. The tube formed by the casing 18 is suitable to position the patient 17 on a patient bed 16 in the tube so that he can be examined with the nuclear magnetic resonance tomography apparatus.

However, the conduits 2 can also be situated inside the body of the magnetic coil 1 or run through said magnetic coil 1, which is different than in Figures described here. Moreover, the conduit 2 can also be fashioned as channels in an aluminum tube that is multiple centimeters thick.

Deviating from the structure specifically shown in the drawings, the magnetic coils 1, the radio-frequency coil 19 and also the conduit 1 in heat-conducting contact with the magnet coils 1 need not be shaped annularly, but rather as polygons and/or cylindrically shaped or even asymmetrical bodies, for example.

Although liquid helium 3 is presently necessary as a coolant in order to cool superconducting materials (that are suitable for constructing magnetic coils 1) below the transition temperature, it is not precluded that other coolants will be used in apparatuses for magnetic resonance tomography in the future. Therefore, the embodiments of this invention are not limited to the use of liquid helium 3 as a coolant.

Although modifications and changes may be suggested by those skilled in the art, it is the intention of the inventor to embody within the patent warranted hereon all changes and modifications as reasonably and properly come within the scope of his contribution to the art.

I claim as my invention:

1. A magnetic field generation device for a magnetic resonance tomography apparatus, said magnetic field generation device comprising:
   a vacuum container that generates a vacuum inside of the vacuum container;
   at least one magnetic coil made of superconducting material that is enclosed by said vacuum container;
   a pipe system comprising at least one conduit in heat-transferring communication with said magnetic coil, said conduit containing a liquid coolant therein that places said superconducting material in a superconducting state during a normal operating condition of said magnetic resonance tomography apparatus, and at least a portion of said liquid coolant transitioning to a gas in a non-normal operating state of said magnetic resonance tomography apparatus;
   a capture container; and
   a valve connected with said pipe system that regulates passage of said gas between said pipe system and an interior of said capture container.

2. A magnetic field generation device as claimed in claim 1 wherein said capture container is formed by said vacuum container.

3. A magnetic field generation device as claimed in claim 1 wherein said magnetic coil is formed in a coil winding, and wherein said at least one conduit proceeds along said coil winding.

4. A magnetic field generation device as claimed in claim 1 comprising a pressure sensor in said pipe system that causes said valve to open upon detection of a pressure associated with said non-normal operating condition.

5. A magnetic field generation device as claimed in claim 1 wherein said valve comprises a pressure sensor that opens said valve upon sensing of a pressure associated with said non-normal operating condition.

6. A magnetic field generation device as claimed in claim 1 wherein said valve is a first valve, and comprising a second valve that regulates passage of said gas between said interior of said capture container and an ambient space outside of said capture container.

7. A magnetic field generation device as claimed in claim 1 wherein said conduit is a first conduit, and comprising a second conduit that places said capture container in a circulating fluid communication with a remainder of said pipe system.

8. A magnetic field generation device as claimed in claim 1 wherein said capture container is a reservoir that is connected to said pipe system only by said conduit, said reservoir having a reservoir outlet allowing said gas to exit said reservoir to an exterior of said reservoir.

9. A magnetic resonance tomography apparatus comprising:
   a magnetic resonance data acquisition unit;
   a vacuum container in said data acquisition unit that generates that generates a vacuum inside of the vacuum container;
   at least one magnetic coil that generates a static magnetic field in said data acquisition device, said at least one magnetic coil being made of superconducting material that is enclosed by the vacuum container;
   a pipe system comprising at least one conduit in heat-transferring communication with said magnetic coil, said conduit containing a liquid coolant therein that places said superconducting material in a superconducting state during a normal operating condition of said magnetic resonance tomography apparatus, and at least a portion of said liquid coolant transitioning to a gas in a non-normal operating state of said magnetic resonance tomography apparatus;
   a capture container; and
   a valve connected with said pipe system that regulates passage of said gas between said pipe system and an interior of said capture container.

10. A magnetic resonance tomography apparatus as claimed in claim 9 wherein said capture container is formed by said vacuum container.

11. A magnetic resonance tomography apparatus as claimed in claim 9 wherein said magnetic coil is formed in a coil winding, and wherein said at least one conduit proceeds along said coil winding.

12. A magnetic resonance tomography apparatus as claimed in claim 9 comprising a pressure sensor in said pipe system that causes said valve to open upon detection of a pressure associated with said non-normal operating condition.

13. A magnetic resonance tomography apparatus as claimed in claim 9 wherein said valve comprises a pressure sensor that opens said valve upon sensing of a pressure associated with said non-normal operating condition.

14. A magnetic resonance tomography apparatus as claimed in claim 9 wherein said valve is a first valve, and comprising a second valve that regulates passage of said gas between said interior of said capture container and an ambient space outside of said capture container.

15. A magnetic resonance tomography apparatus as claimed in claim 9 wherein said conduit is a first conduit, and comprising a second conduit that places said capture container in a circulating fluid communication with a remainder of said pipe system.

16. A magnetic resonance tomography apparatus as claimed in claim 9 wherein said capture container is a reservoir that is connected to said pipe system only by said conduit, said reservoir having a reservoir outlet allowing said gas to exit said reservoir to an exterior of said reservoir.

* * * * *